United States Patent
Wu et al.

(10) Patent No.: US 6,400,007 B1
(45) Date of Patent: Jun. 4, 2002

(54) STACKED STRUCTURE OF SEMICONDUCTOR MEANS AND METHOD FOR MANUFACTURING THE SAME

(75) Inventors: Jichen Wu; Meng Ru Tsai; Nai Hua Yeh; Chen Pin Peng, all of Hsinchu Hsien (TW)

(73) Assignee: Kingpak Technology Inc., Hsinchu Hsien (TW)

( * ) Notice: Subject to any disclaimer, the term of this patent is extended or adjusted under 35 U.S.C. 154(b) by 0 days.

(21) Appl. No.: 09/836,107

(22) Filed: Apr. 16, 2001

(51) Int. Cl.[7] ............................................... H01L 23/02
(52) U.S. Cl. ..................... 257/686; 257/723; 257/777; 438/107; 438/109
(58) Field of Search ................................. 257/686, 723, 257/777, 724, 725; 438/109, 107, 124, 126, 127

(56) References Cited

U.S. PATENT DOCUMENTS

| | | | | |
|---|---|---|---|---|
| 5,804,874 A | * | 9/1998 | An et al. ..................... | 257/676 |
| RE36,613 E | * | 3/2000 | Ball ............................. | 257/676 |
| 6,087,718 A | * | 7/2000 | Cho ............................. | 257/686 |
| 6,100,594 A | * | 8/2000 | Fukui et al. ................. | 257/685 |
| 6,180,881 B1 | * | 1/2001 | Isaak .......................... | 174/52.2 |
| 6,271,598 B1 | * | 8/2001 | Vindasius et al. .......... | 257/777 |
| 6,316,727 B1 | * | 11/2001 | Liu .............................. | 257/686 |

* cited by examiner

Primary Examiner—Kevin M. Picardat
(74) Attorney, Agent, or Firm—Pro-Techtor International Services

(57) ABSTRACT

An stacked structure of semiconductor means and method for manufacturing the same, comprises a substrate, a lower semiconductor chip, an adhered glue layer, a plurality of wires and an upper semiconductor chip. The adhered glue layer located between the substrate and the lower semiconductor to adhere the lower semiconductor to the substrate. The overflow glue of the adhered glue layer covered above the periphery of the lower semiconductor chip. The plurality of wires each being electrically connected to the lower semiconductor chip and the substrate, so that each wires are located above the overflow glue. The upper semiconductor chip is located above lower semiconductor chip and electrically connected to the substrate.

11 Claims, 1 Drawing Sheet

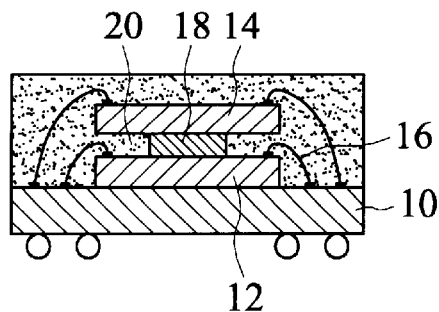
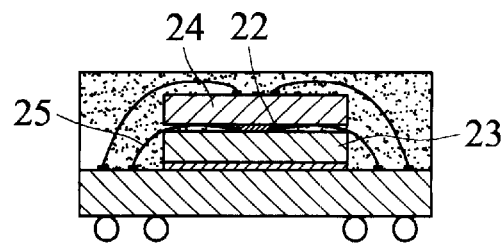
FIG. 1
(PRIOR ART)
FIG. 2
(PRIOR ART)
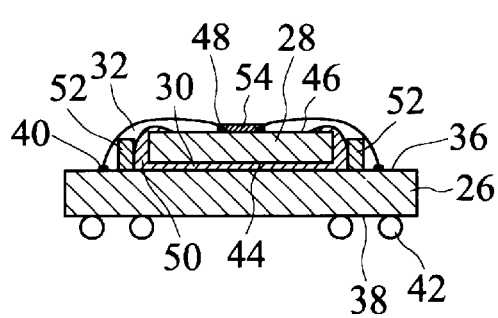
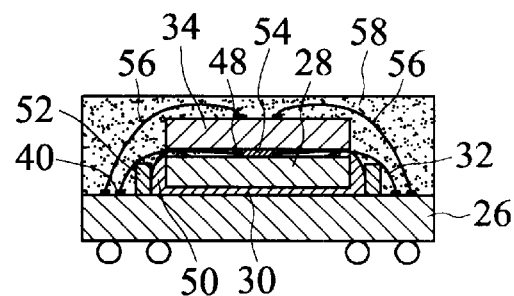
FIG. 3
FIG. 4
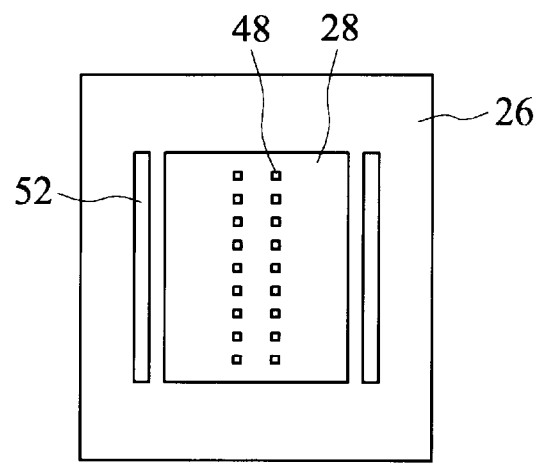
FIG. 5

STACKED STRUCTURE OF SEMICONDUCTOR MEANS AND METHOD FOR MANUFACTURING THE SAME

BACKGROUND OF THE INVENTION

1. Field of the invention

The invention relates to a stacked semiconductor package structure having films and method for manufacturing the films, in particular, to a semiconductor package structure capable of preventing the semiconductor chips from being badly electrically connected or short-circuited and facilitating the manufacturing processes.

2. Description of the Related Art

To meet the demands of manufacturing small, thin, and light products, a lot of semiconductor chips can be stacked. However, when stacking a lot of semiconductor chips, the upper semiconductor chip will contact and press the wirings of the lower semiconductor chip. In this case, the signal transmission to or from the lower semiconductor chip is adversely influenced.

Referring to FIG. 1, a structure of stacked semiconductor chips includes a substrate 10, a lower semiconductor chip 12, an upper semiconductor chip 14, a plurality of wirings 16, and an isolation layer 18. The lower semiconductor chip 12 is located on the substrate 10. The isolation layer 18 is located on the lower semiconductor chip 12. The upper semiconductor chip 14 is stacked on the isolation layer 18. That is, the upper semiconductor chip 14 is stacked above the lower semiconductor chip 12 with the isolation layer 18 interposed between the semiconductor chips 12 and 14. Thus, a proper gap 20 is formed between the lower semiconductor chip 12 and the upper semiconductor chip 14. According to this structure, the plurality of wirings 16 can be electrically connected to the edge of the lower semiconductor chip 12. Furthermore, when stacking the upper semiconductor chip 14 above the lower semiconductor chip 12, the plurality of wirings 16 connecting the substrate 10 to the lower semiconductor chip 12 are free from being pressed, or the plurality of wirings 16 and the lower semiconductor chip 12 are free from being short-circuited.

However, the above-mentioned structure has the disadvantages to be described hereinbelow. During the manufacturing processes, the isolation layer 18 has to be manufactured in advance, and then, it is adhered to the lower semiconductor chip 12. Thereafter, the upper semiconductor chip 14 is adhered on the isolation layer 18. As a result, the manufacturing processes are complicated, and the manufacturing costs are high.

Furthermore, if the bonding pads of the lower semiconductor chip 12 are formed at the central portion thereof, it is impossible for the semiconductor chips to be stacked.

As shown in FIG. 2, bonding pads 22 are formed at the central portion of the lower semiconductor chip 23. In this case, the upper semiconductor chip 24 presses the wirings 25 to contact the edge of the lower semiconductor chip 23, thereby adversely influencing the signal transmission or causing the above-mentioned elements to be short-circuited.

To solve the above-mentioned problems, it is necessary for the invention to provide a stacked semiconductor package structure having films and method for manufacturing the same, in order to facilitate the manufacturing processes and lower down the manufacturing costs.

SUMMARY OF THE INVENTION

It is therefore an object of the invention to provide a stacked structure of a semiconductor means and method for manufacturing the same, so as to facilitate the stacking processes of the semiconductor means and improve the manufacturing speed.

It is therefore another object of the invention to provide a stacked structure of a semiconductor means and method for manufacturing the same, so as to avoid bad signal transmission when stacking the semiconductor chips.

It is therefore still another object of the invention to provide a stacked structure of a semiconductor means and method for manufacturing the same, so as to prevent the wires connected to the lower integrated circuit from being damaged by the upper integrated circuit, thereby facilitating the manufacturing processes.

To achieve the above object, one aspect of the present invention comprises a substrate, a lower semiconductor chip, an adhered glue layer, a plurality of wires and an upper semiconductor chip. The substrate having a first surface and a second surface opposite to the first surface, the first surface formed with signal input terminals, then, the second surface formed with signal output terminals for electrically connected to the printed circuit board.

a lower semiconductor chip having a upper surface and a lower surface, the central part of the upper surface formed with a plurality of bonding pads:

a adhered glue resin located between the substrate and the lower semiconductor for adhering the lower surface of the semiconductor to the first surface of the substrate. The overflow glue of the adhered glue resin covered over the periphery of the lower semiconductor chip:

a plurality of wires each having a first end and second end away from the first end, the first end being electrically connected to the bonding pads of the lower semiconductor chip, the second end being electrically connected to the signal input terminals in order to signals from the lower semiconductor chip are capable of being transmitted to the substrate.

a upper semiconductor chip located on the upper surface of the semiconductor chip to stack above the lower semiconductor chip and electrically connected to the signal input terminals of the substrate.

Thus, while the upper semiconductor stacked with the lower semiconductor, the overflow glue of the adhered glue layer covered the upper surface of the lower semiconductor for protecting the plurality of wires, so as to avoid bad signal transmission when stacking the semiconductor means.

BRIEF DESCRIPTION OF THE DRAWINGS

FIG. 1 is a cross-sectional view showing a conventional stacked semiconductor means package structure.

FIG. 2 is a schematic illustrate showing another conventional stacked semiconductor means package structure.

FIG. 3 is a schematic illustration showing a stacked structure of a semiconductor means according to the present invention.

FIG.4 is a cross-sectional showing a stacked structure of a semiconductor means of the invention.

FIG.5 is another schematic illustrated showing a stacked structure of a semiconductor means of the invention.

DETAIL DESCRIPTION OF THE INVENTION

Referring to FIG. 1, FIG. 2 and FIG. 3, the stacked structure of semiconductor means includes a substrate 26, a lower semiconductor chip 28, an adhered glue layer 30, a plurality of wires 32 and an upper semiconductor chip 34.

The substrate 26 includes a first surface 36 and a second surface 38 opposite to the first surface, the first surface 36 is formed with signal input terminals 40. While the second surface 38 is formed with signal output terminals 42. The signal output terminals 42 may be metallic balls arranged in the form of a ball grid array for electrically connected to a printed circuit board (not shown).

The lower semiconductor chip 28 has a lower surface 44 and an upper surface 46. The lower surface 44 is mounted onto the first surface 36 of the substrate 26. The central region of the upper surface 46 is formed with a plurality of bonding pads 48 for electrically connected the signal input terminals 40 of the substrate 26.

A adhered glue layer 30 is located between the lower surface 44 of the lower semiconductor chip 28 and the first surface 36 of the substrate 26 for adhering the lower semiconductor chip 28 to the substrate 26. While the lower semiconductor chip 28 is adhered to the substrate 26, the overflow glue 50 of the adhered glue layer 30 is extend cover the periphery of the lower semiconductor 28. A projecting element 52 is formed on the periphery of the substrate 26 for extending the overflow glue 50 to the periphery of the upper surface 46. The preferred embodiment of the present invention, the projecting element 52 may be a dam.

Referring to FIG.4 that is a cross-sectional showing a stacked structure of semiconductor means of the invention. After the lower semiconductor 28 is placed on the first surface 36 of the substrate 26. One end of the plurality of wires 32 are electrically connected to the bonding pads 48 formed on the central region of the semiconductor chip 26. Other end of the plurality of wires are electrically connected to the signal input terminals 40 of the substrate 26, thus the signal from the lower semiconductor 26 is transmitted to the substrate 26. The plurality of wires 32 are located over overflow glue 52, so that while upper semiconductor chip 34 is stacked above lower semiconductor chip 28 by adhered glue 50, the plurality of wires 32 can not electrically contact with the lower semiconductor chip 26. The upper semiconductor chip 34 is electrically connected to the signals input terminals 40 by the plurality of wires 56.

A package layer 58 is covered onto the substrate 26, lower semiconductor 28 and upper semiconductor chip 34 for preventing the wires 32, 56. To achieve the stacked semiconductor means package.

According to the above-mentioned structure, the stacked semiconductor means have the following advantages.

1. When the upper semiconductor chip 34 is stacked above the lower semiconductor chip 28, the wires 32 are separated from the lower semiconductor chip 28 by the overflow glue 50 of the adhered glue layer 30. Although the wires 32 are pressed by the upper semiconductor chip 34, the wires 32 and the semiconductor chip 28 are free from being short-circuited.

2. When the lower semiconductor chip 28 is adhered to the substrate 26, the overflow glue 58 of the adhered glue layer 30 is extend covered the periphery of the upper surface 48 of the lower semiconductor chip 28, so that the wires are free from being short-circuited. Thereby facilitating the manufacturing processes.

While the invention has been described by way of example and in terms of preferred embodiments, it is to be understood that the invention is not limited to the disclosed embodiments. To the contrary, it is intended to cover various modifications. Therefore, the scope of the appended claims should be accorded the broadest interpretation so as to encompass all such modifications.

What is claimed is:

1. A stacked structure of semiconductor means used for electrically connecting to a printed circuit board, comprising:

a substrate having a first surface and a second surface opposite to the first surface, the first surface formed with signal input terminals, then, the second surface formed with signal output terminals for electrically connected to the printed circuit board;

a lower semiconductor chip having a upper surface and a lower surface, the central part of the upper surface formed with a plurality of bonding pads;

an adhered glue layer located between the substrate and the lower semiconductor for adhering the lower surface of the semiconductor to the first surface of the substrate, the overflow glue of the adhered glue layer covered above the periphery of the lower semiconductor chip;

a plurality of wires each having a first end and second end away from the first end, the first end being electrically connected to the bonding pads of the lower semiconductor chip, the second end being electrically connected to the signal input terminals so that signals from the lower semiconductor chip are capable of being transmitted to the substrate, an upper semiconductor chip located on the upper surface of the semiconductor chip to stack above the lower semiconductor chip and electrically connected to the signal input terminals of the substrate.

2. The stacked structure of a semiconductor means according to claim 1, wherein the signals output terminals of the substrate are metallic balls arranged in the form of a ball grid array.

3. The stacked structure of a semiconductor means according to claim 1, wherein a projecting element is formed on the periphery of the first surface of the substrate to stop the overflow glue of the adhered glue resin. Thus the overflow glue covered above the upper surface of the lower semiconductor chip.

4. The stacked structure of a semiconductor means according to claim 3, wherein the projecting element is a dam.

5. The stacked structure of a semiconductor means according to claim 1, wherein the upper semiconductor chip being electrically connected to the signal input terminals of the substrate by a plurality of wires.

6. The stacked structure of a semiconductor means according to claim 1, wherein a package layer provided on the lower semiconductor chip and the upper semiconductor chip for preventing the lower semiconductor chip, the upper semiconductor chip and wires.

7. A method for manufacturing a stacked structure of semiconductor means, comprising the steps:

providing a substrate having a first surface and a second surface opposite to the first surface, the first surface formed with signal input terminals, then, the second surface formed with signal output terminals;

providing a lower semiconductor chip having an upper surface and a lower surface, a plurality of pads arranged on the central of the upper surface of the lower semiconductor chip;

placing a adhered glue layer between the lower surface of the lower semiconductor chip and the upper surface of the substrate for adhering the lower semiconductor chip to the substrate, so that the overflow glue of the adhered glue layer covered above the upper surface of the lower semiconductor chip;

providing a plurality of wires having a first end and second end, the first end being electrically connected to the pads of the lower semiconductor chip, and the second end electrically connected to the signal input terminal of the substrate; and placing an upper semiconductor chip over the upper surface of the lower semiconductor chip to formed stacked with lower semiconductor chip, and the upper semiconductor chip being electrically connected to the signal input terminal of the substrate.

8. The method for manufacturing a stacked structure of a semiconductor means according to claim 7, wherein the signal output terminals of the substrate are metallic balls arranged in the form of a ball grid array.

9. The method for manufacturing a stacked structure of a semiconductor means according to claim 7, wherein a projecting element is formed on the periphery of the first surface of the substrate to stop the overflow glue of the adhered glue resin. So that the overflow glue is covered the upper surface of the lower semiconductor chip.

10. The method for manufacturing a stacked structure of a semiconductor means according to claim 9, wherein the projecting element is a dam.

11. The method for manufacturing a stacked structure of a semiconductor means according to claim 7, wherein a package layer provided on the lower semiconductor chip and the upper semiconductor chip for preventing the lower semiconductor chip and the upper semiconductor chip.

\* \* \* \* \*